United States Patent
Horng

(10) Patent No.: US 8,893,378 B2
(45) Date of Patent: Nov. 25, 2014

(54) METHOD FOR SECURING A CARRIER BY GAS PRESSURIZATION TO INHIBIT WARPAGE OF THE CARRIER

(71) Applicant: Chih-Horng Horng, Hsinchu (TW)

(72) Inventor: Chih-Horng Horng, Hsinchu (TW)

(73) Assignee: Ableprint Technology Co., Ltd., Hsinchu (TW)

( * ) Notice: Subject to any disclaimer, the term of this patent is extended or adjusted under 35 U.S.C. 154(b) by 204 days.

(21) Appl. No.: 13/645,281

(22) Filed: Oct. 4, 2012

(65) Prior Publication Data
US 2013/0152363 A1 Jun. 20, 2013

(30) Foreign Application Priority Data
Dec. 16, 2011 (TW) .............................. 100146868 A

(51) Int. Cl.
*B23P 19/00* (2006.01)

(52) U.S. Cl.
USPC .......................................................... 29/743

(58) Field of Classification Search
USPC ............ 29/743, 729, 428, 464; 294/188, 183, 294/186, 64.3, 65
See application file for complete search history.

(56) References Cited

U.S. PATENT DOCUMENTS

| | | | |
|---|---|---|---|
| 7,726,715 B2 | 6/2010 | Nagasawa et al. | ............ 294/64.1 |
| 8,823,170 B2 * | 9/2014 | Wu et al. | ........................ 257/737 |
| 2006/0232085 A1 | 10/2006 | Nagasawa et al. | ............ 294/64.1 |

FOREIGN PATENT DOCUMENTS

| | | | |
|---|---|---|---|
| EP | 0 244 137 A2 | 4/1987 | ............. H01L 21/68 |
| JP | 09-180990 | 7/1997 | ............. H01L 21/027 |
| JP | 09-326385 | 12/1997 | .......... H01L 21/3065 |
| JP | 09/326385 | 12/1997 | .......... H01L 21/3065 |
| JP | 2000-243814 | 9/2000 | ............. H01L 21/68 |
| JP | 2009-043996 | 2/2009 | ............. H01L 21/683 |
| JP | 2009-152574 | 7/2009 | ............. H01L 21/02 |
| TW | 200507043 A | 10/1993 | ............. H01L 21/00 |
| TW | 201108344 A | 1/2011 | ............. H01L 21/304 |

* cited by examiner

*Primary Examiner* — John C Hong
(74) *Attorney, Agent, or Firm* — Martine Penilla Group, LLP

(57) ABSTRACT

This invention relates to a method for securing a carrier by gas pressurization to inhibit warpage of the carrier. The method includes following steps: provide a carrier with an upper surface and a lower surface which are opposite to each other; providing an evacuable jig with an apertured surface on which a plurality of apertures are provided; placing and securing one of the upper and lower surfaces of the carrier on the apertured surface in a manner of facing the apertured surface, wherein the surface of the carrier faced to the apertured surface is defined as a first surface, and the other surface opposed to the first surface is defined as a second surface; and gas pressurizing a chamber and evacuating the jig positioned in the chamber, to form a pressure difference between the first surface and the second surface of the carrier, whereby the carrier is pressed on the jig, wherein the chamber is pressurized to a predetermined pressure greater than a standard atmospheric pressure.

10 Claims, 4 Drawing Sheets

METHOD FOR SECURING A CARRIER BY GAS PRESSURIZATION TO INHIBIT WARPAGE OF THE CARRIER

CROSS-REFERENCE TO RELATED APPLICATION

This application claims the priority benefit of Taiwan Application Serial No. 100146868, filed on Dec. 16, 2011. All disclosure thereof is incorporated herein by reference.

BACKGROUND OF THE INVENTION

A. Field of the Invention

This invention relates to a method for securing a carrier, and more particularly relates to a method for securing a carrier by gas pressurization to inhibit warpage of the carrier.

B. Description of the Prior Art

Warpage of a package results from different thermal expansion coefficients of different materials in the package. To overcome the warpage problem, various methods have been disclosed in the field of packaging. Taiwan Patent No. I259743, for example, discloses disposing a plurality of non-functional traces inside a substrate so as to utilize the counteraction of stresses generated by the non-functional traces to maintain the flatness of the substrate. However, this method may complicate the circuit layout and thus makes it difficult to perform the circuit layout inside the substrate. Besides, Taiwan Patent Publication No. 489496, for instance, discloses disposing a glue bank, having a thermal expansion coefficient higher than that of the substrate, on the substrate so as to inhibit the warpage of the substrate. Nevertheless, since the glue bank still remains inside the manufactured semiconductor package after the process, the surface of the substrate needs to reserve an area for disposing the glue bank, which prevents further miniaturization of package size. Additionally, for example, Taiwan Patent No. I231578 discloses disposing a plurality of stiffening members under a substrate and using a stiffener encapsulant encapsulating the stiffening members, thereby inhibiting the warpage of the substrate. However, because each stiffening member should correspond to the peripheral of the chip-disposing region of the substrate, it is difficult to align while disposing the stiffening members. Especially, if there are more chip-disposing regions on the substrate, the alignment of the stiffening members gets even more complicated, which prevents miniaturizing package size and wastes the substrate. Moreover, Taiwan Patent No. I340446 discloses that a substrate is fixed by adhering temporary stiffeners to a trash portion of the substrate so as to counteract the warpage generated due to the thermal expansion of the substrate, and the temporary stiffeners are cut and removed in the last stage of the process. Furthermore, similar to the method of the aforementioned Patent No. I340446, Taiwan Patent No. I352395, for instance, discloses that a double-sided tape is temporarily adhered to secure a substrate to a hard and heat-resistant carrier through the tape, and the temporarily adhered double-sided tape and the carrier are removed in the last stage of the process. Although the above methods can overcome the warpage problem of a substrate in the process, those methods complicate the process and increase the manufacturing cost. Considering problems the above conventional technologies encounter, a method which can inhibit warpage of a carrier is urgently required.

SUMMARY OF THE INVENTION

In order to solve problems the above conventional technologies encounter, according to one embodiment of the invention, a method for securing a carrier by gas pressurization to inhibit warpage of the carrier is provided, the method comprising: providing a carrier having an upper surface and a lower surface, the upper surface and the lower surface being opposite to each other; providing an evacuable jig, which has an apertured surface on which a plurality of apertures are provided; placing and securing one of the upper and lower surfaces of the carrier on the apertured surface, so that the one of the upper and lower surfaces faces the apertured surface, wherein the surface of the carrier facing the apertured surface is defined as a first surface, and the other surface opposite to the first surface is defined as a second surface; and gas pressurizing a chamber and evacuating the evacuable jig positioned in the chamber, so as to form a pressure difference between the first surface and the second surface of the carrier, whereby the carrier is pressed on the jig, wherein the chamber is pressurized to a predetermined pressure greater than a standard atmospheric pressure.

According to another embodiment of the invention, a method for securing a carrier by gas pressurization to inhibit warpage of the carrier is provided, the method comprising: providing a carrier having an upper surface and a lower surface, the upper surface and the lower surface being opposite to each other; providing an evacuable jig, which has an apertured surface on which a plurality of apertures are provided; placing one of the upper and lower surfaces of the carrier on the apertured surface, so that the one of the upper and lower surfaces faces the apertured surface, wherein the surface of the carrier facing the apertured surface is defined as a first surface, and the other surface opposite to the first surface is defined as a second surface; vacuum-evacuating the jig to secure the carrier to the jig; placing the jig with the carrier fixed thereon into a gas pressurizable chamber; and gas pressurizing the chamber to form a pressure difference between the first surface and the second surface of the carrier, whereby the carrier is pressed on the jig, wherein the chamber is pressurized to a predetermined pressure greater than a standard atmospheric pressure.

Other aspects and advantages of the invention will become apparent by reference to the following detailed description combined with the appended drawings for illustrating the principle examples of the invention. In addition, well-known devices and principles are not further described in the specification so as not to unnecessarily obscure the invention.

BRIEF DESCRIPTION OF THE DRAWINGS

One skilled in the art can appreciate that the appended drawings of the invention are merely schematic views, which are not necessarily drawn to scale. Furthermore, the appended drawings of the invention are merely illustrative and not restrictive. Moreover, in the appended drawings of the invention, the same component is denoted by the same reference numeral.

DETAILED DESCRIPTION OF THE PREFERRED EMBODIMENTS

The embodiments of the invention are illustrated below by reference to the drawings.

Figure 1:
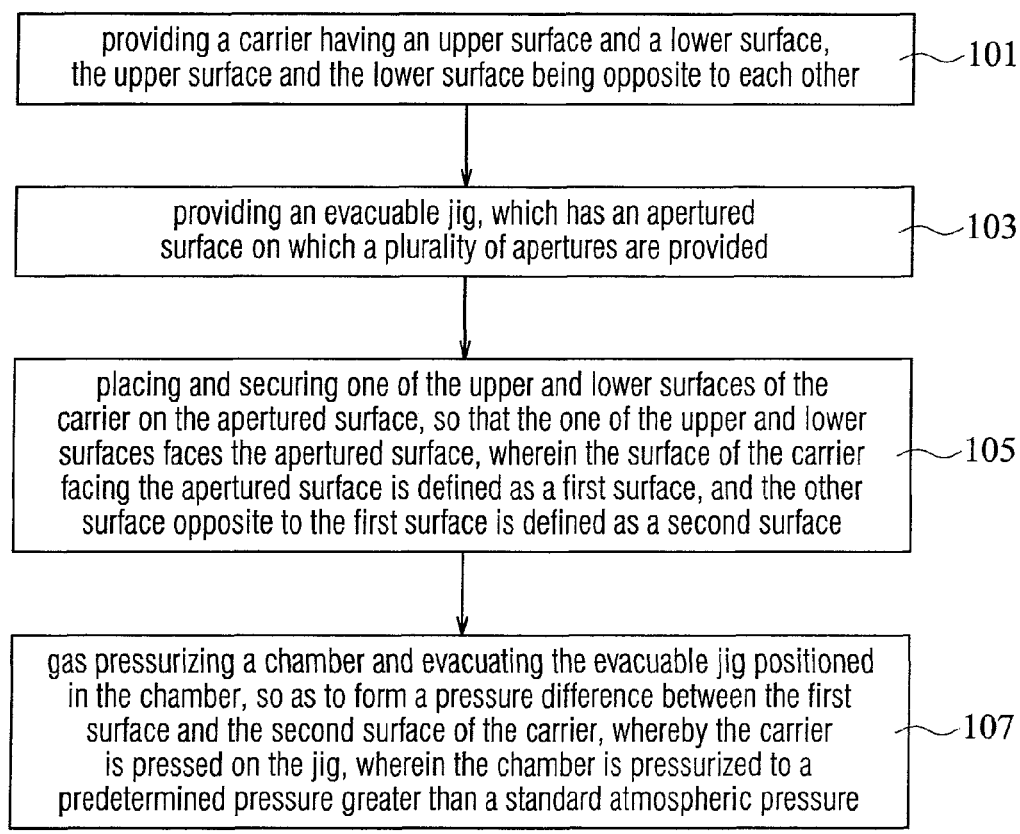
FIG. 1 shows a flow chart of a method for securing a carrier by gas pressurization to inhibit warpage of the carrier according to one embodiment of the invention.

According to one embodiment of the invention, FIG. 1 shows a flow chart 100 of a method for securing a carrier by gas pressurization to inhibit warpage of the carrier. The flow chart 100 begins at step 101, wherein a carrier having an upper surface and a lower surface is provided. The upper surface and the lower surface of the carrier are opposite to each other.

In step 103, an evacuable jig is prepared. The evacuable jig can have an apertured surface on which a plurality of apertures are provided.

In step 105, one of the upper surface and the lower surface of the carrier are placed and secured on the apertured surface so that the surface of the carrier can face the apertured surface. For example, the surface of the carrier facing the apertured surface is defined as a first surface, and the other surface, which is opposite to the first surface, is defined as a second surface. Specifically, when the upper surface of the carrier is defined as the first surface, the lower surface of the carrier is defined as the second surface; on the contrary, when the lower surface of the carrier is defined as the first surface, the upper surface of the carrier is defined as the second surface. The method for securing the surface of the carrier to the apertured surface can comprise at least one of the following: using an adhesive material to secure the surface of the carrier to the apertured surface; using a pressing plate, which can avoid an active region of the carrier, to secure the surface of the carrier to the apertured surface; vacuum-evacuating the evacuable jig so that the surface of the carrier can be vacuum-sucked to the apertured surface; and utilizing the weight of the carrier itself to secure the surface of the carrier to the apertured surface.

The jig with the carrier fixed thereon is in a gas pressurizable chamber.

In step 107, the chamber is gas-pressurized and the evacuable jig is evacuated, so that a pressure difference can be formed between the first and the second surfaces of the carrier to press the carrier to the jig, wherein the chamber is pressurized to a predetermined pressure greater than a standard atmospheric pressure. For example, the step can be performed in one of the following ways: evacuating the evacuable jig after gas pressurizing the chamber; gas pressurizing the chamber after evacuating the evacuable jig; and gas pressurizing the chamber and evacuating the evacuable jig simultaneously. In addition, the amount of inflation for gas pressurizing the chamber is greater than the amount of evacuation for evacuating the evacuable jig.

Figure 2:
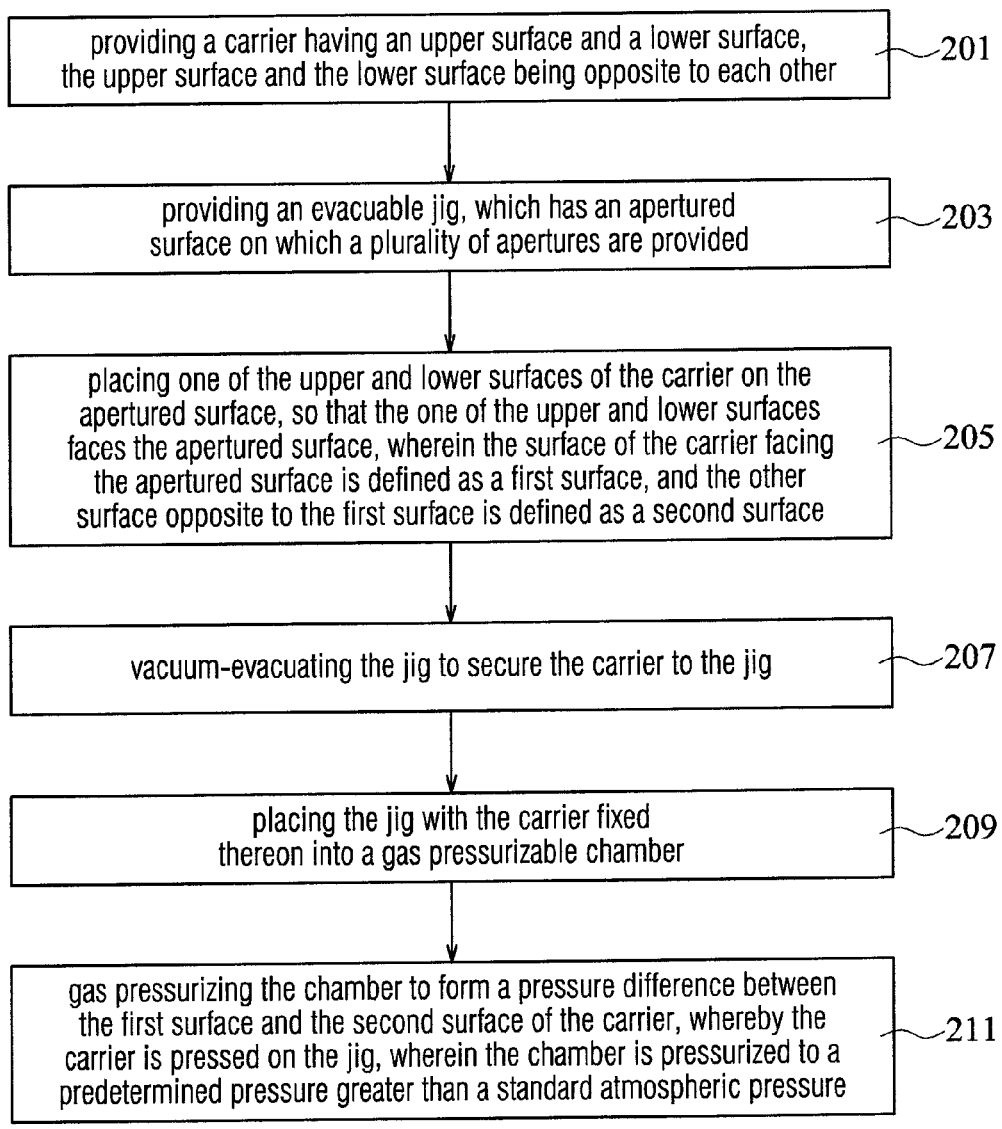
FIG. 2 shows a flow chart of a method for securing a carrier by gas pressurization to inhibit warpage of the carrier according to another embodiment of the invention.

According to another embodiment of the invention, FIG. 2 shows a flow chart 200 of a method for securing a carrier by gas pressurization to inhibit warpage of the carrier. The flow chart 200 begins at step 201, wherein a carrier having an upper surface and a lower surface is provided. The upper surface and the lower surface of the carrier are opposite to each other.

In step 203, an evacuable jig is prepared. The jig has an apertured surface on which a plurality of apertures are provided.

In step 205, one of the upper surface and the lower surface of the carrier are placed on the apertured surface so that the surface of the carrier can face the apertured surface. For example, the surface of the carrier facing the apertured surface can be defined as a first surface, and the other surface, which is opposite to the first surface, can be defined as a second surface. As described above, when the upper surface of the carrier is defined as the first surface, the lower surface of the carrier is defined as the second surface; on the contrary, when the lower surface of the carrier is defined as the first surface, the upper surface of the carrier is defined as the second surface.

In step 207, the jig is vacuum-evacuated so that the carrier can be secured to the jig. The step can further comprise the following step: using a pressing plate, which can avoid an active region of the carrier, to secure the carrier to the apertured surface.

In step 209, the jig with the carrier fixed thereon is placed into a gas pressurizable chamber.

In step 211, the chamber is gas-pressurized so that a pressure difference can be formed between the first and the second surfaces of the carrier to press the carrier to the jig, wherein the chamber is pressurized to a predetermined pressure greater than a standard atmospheric pressure.

In embodiments of the invention, for example, the carrier can be at least one of the following a printed circuit board, a substrate, a lead frame, a wafer, a silicon interposer, and a package.

In embodiments of the invention, the predetermined pressure, for instance, can range from 1 atm ($kg/cm^2$) to about 30 atm ($kg/cm^2$). For example, in one embodiment of the invention, the predetermined pressure is greater than 1 atm and less than or equal to about 30 atm. However, it can be appreciated that the above pressure range can comprise 1.5, 2, 4, 6, 8, 10, 12, 14, 20, 25, 30 atm and all values therebetween, such as 2.5, 3, 5.5, 8.5, 9, 11, 15.5, 23, 27.5, 29, etc.

In one embodiment of the invention, for example, after the pressure in the chamber reaches the predetermined pressure, the evacuation (or vacuum-evacuation) of jig is shut off, and the carrier is pressed to the jig through the generated high pressure difference.

In one embodiment of the invention, at least one heat-resistant sealing layer is disposed between the first surface of the carrier and the apertured surface of the jig, wherein the heat-resistant sealing layer does not cover the apertures of the apertured surface. The heat-resistant sealing layer, for example, can resist a processing temperature ranging from 40° to 300°.

Figure 3:
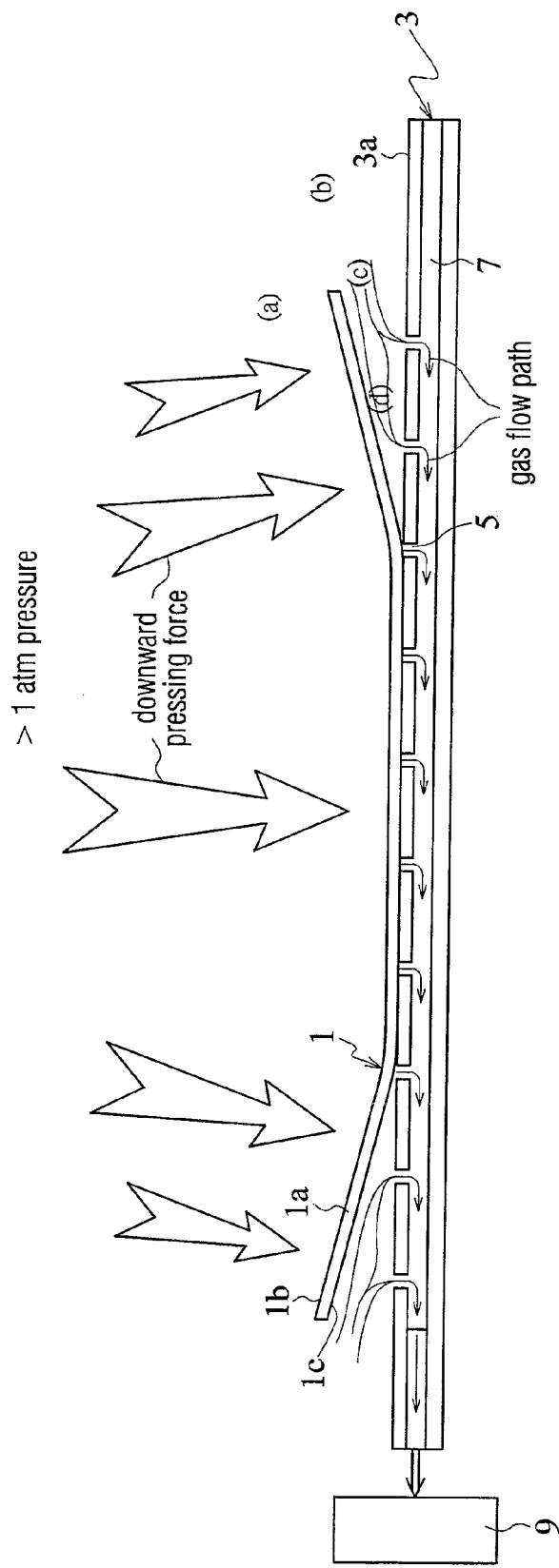
FIG. 3 shows a schematic cross-section view illustrating the principle of the invention.

The principle of the invention is illustrated below by reference to FIG. 3. FIG. 3 is a schematic cross-section view illustrating the principle of the invention. As described in FIG. 3, a carrier 1 having a warpage portion 1a is placed on an evacuable jig 3. The carrier 1 can have an upper surface 1b and a lower surface 1c. The upper surface 1b and the lower surface 1c are opposite to each other. The evacuable jig 3 can have an apertured surface 3a and a gas passage 7. The apertured surface 3a can include a plurality of apertures 5. The gas passage 7 is coupled to an evacuation device 9. In embodiments of the invention, the evacuation device 9, for example, can be a common exhaust pump, a vacuum pump, or a switch of an exhaust passage.

According to the fluid continuity equation: $A_1 V_1 = A_2 V_2 =$ constant (wherein $A_1$ and $A_2$ are areas, and $V_1$ and $V_2$ are fluid velocities), and thus the flowing mass of gas per unit time remains even. Therefore, gas closer to the aperture 5 has a higher flowing velocity. Besides, according to Bernoulli's theorem: $\rho v^2/2 + \rho g h + p =$ constant, wherein $\rho$ is gas density; v is gas velocity; p is gas pressure; g is gravity acceleration; h is height; and potential ($\rho g h$) is extremely small and can be ignored. Since gas farther from the aperture 5 has a slower velocity, the magnitude of gas pressure in each position of FIG. 3 is ordered as follows: (d)<(c)<(b)<(a). Hence, the downward pressing force generated by the pressure difference can press an object to be processed (i.e. the carrier) tightly to the jig 3, so as to counter the warpage resulting from uneven thermal expansion in high temperature. Namely, in FIG. 3, for example, an extremely large pressure difference is formed between the lower surface 1c of the carrier 1 (defined as the first surface in the embodiment, namely the surface facing the apertured surface 3a) and the upper surface 1b (defined as the second surface in the embodiment), and further generates an extremely large downward pressing force to press the carrier 1 to the jig 3; thereby, the warpage portion 1a of the carrier 1, caused by high temperature, is pressed tightly toward the jig 3, so that the warpage portion 1a of the carrier can be flatly attached to the jig 3. In another embodiment of the invention, the upper surface 1b of the carrier 1 can face the apertured surface 3a and be secured to the apertured surface 3a, so that the upper surface 1b can be defined as the first surface and the lower surface 1c opposite to the upper surface 1b can be defined as the second surface.

In one embodiment of the invention, positions of the apertures 5 can be opposite to a circumferential position of the carrier 1.

Figure 4:
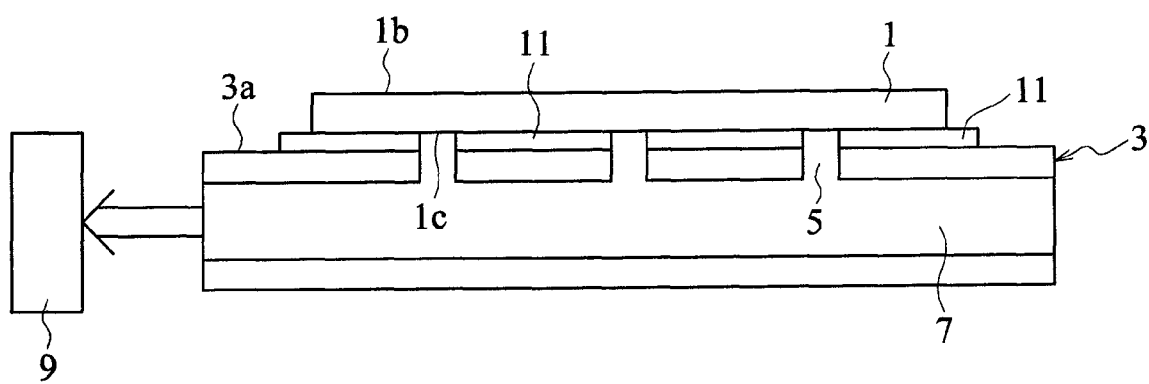
FIG. 4 shows a schematic cross-section view of disposing at least one heat-resistant sealing layer between the first surface of the carrier and the apertured surface of the jig according to one embodiment of the invention.

In addition, as described in FIG. 4, like FIG. 3, the lower surface 1c of the carrier 1 is defined as the first surface, and the upper surface 1b of the carrier 1 is defined as the second surface. According to one embodiment of the invention, in FIG. 4, for example, at least one heat-resistant sealing layer 11 is disposed between the above first surface (the lower surface 1c in this embodiment) of the carrier 1 and the apertured surface 3a of the jig 3, wherein the heat-resistant layer does not cover the aperture 5 of the apertured surface 3a so as to enhance the air tightness between the carrier 1 and the jig 3. The heat resistant sealing layer 11, for instance, can resist a processing temperature ranging from 40° to 300°.

While the present invention has been shown and described by reference to preferred embodiments thereof, and in terms of the illustrative drawings, various possible modifications, alterations, and equivalent substitution could be conceived of by one skilled in the art without departing from the sprit and the scope of the present invention. However, such modifications, alterations, and substitutions still fall within the scope of the claims of the present invention.

What is claimed is:

1. A method for securing a carrier by gas pressurization to inhibit warpage of the carrier, the method comprising:
   providing a carrier having an upper surface and a lower surface, the upper surface and the lower surface being opposite to each other;
   providing an evacuable jig, which has an apertured surface on which a plurality of apertures are provided; placing and securing one of the upper and lower surfaces of the carrier on the apertured surface, so that the one of the upper and lower surfaces faces the apertured surface, wherein the surface of the carrier facing the apertured surface is defined as a first surface, and the other surface opposite to the first surface is defined as a second surface; and
   gas pressurizing a chamber and evacuating the evacuable jig positioned in the chamber, so as to form a pressure difference between the first surface and the second surface of the carrier, whereby the carrier is pressed on the jig, wherein the chamber is pressurized to a predetermined pressure greater than a standard atmospheric pressure.

2. The method of claim 1, wherein the carrier is at least one of a printed circuit board, a substrate, a lead frame, a wafer, a silicon interposer, and a package.

3. The method of claim 1, wherein in the step of placing and securing the one of the upper and lower surfaces of the carrier, the securing method comprises at least one of the following approaches: using an adhesive material to secure the surface of the carrier to the apertured surface; using a pressing plate, which avoids an active region of the carrier, to secure the surface of the carrier to the apertured surface; vacuum-evacuating the evacuable jig so that the surface of the carrier is vacuum-sucked to the apertured surface; and utilizing the weight of the carrier itself to secure the surface of the carrier to the apertured surface.

4. The method of claim 1, wherein the step of gas pressurizing the chamber and evacuating the evacuable jig is performed by one of the following approaches: evacuating the evacuable jig after gas pressurizing the chamber; gas pressurizing the chamber after evacuating the evacuable jig; and gas pressurizing the chamber and evacuating the evacuable jig simultaneously.

5. The method of claim 1, wherein in the step of gas pressurizing the chamber and evacuating the evacuable jig, the amount of inflation for gas pressurizing the chamber is greater than the amount of evacuation for evacuating the evacuable jig.

6. The method of claim 4, wherein in the step of gas pressurizing the chamber and evacuating the evacuable jig, the amount of inflation for gas pressurizing the chamber is greater than the amount of evacuation for evacuating the evacuable jig.

7. The method of claim 1, wherein the predetermined pressure is greater than 1 atm, and less than or equal to 30 atm.

8. The method of claim 1, wherein at least one heat-resistant sealing layer is disposed between the first surface of the carrier and the apertured surface of the jig, wherein the heat-resistant sealing layer does not cover the apertures.

9. The method of claim 8, wherein the heat-resistant sealing layer resists a processing temperature ranging from 40° C. to 300° C.

10. The method of claim 1, wherein positions of the apertures are opposite to a circumferential position of the carrier.

* * * * *